United States Patent [19]

Baer

[11] 3,996,511
[45] Dec. 7, 1976

[54] ELECTRICAL WIRE CONTINUITY TESTING GUN

[75] Inventor: Richard I. Baer, Monson, Mass.

[73] Assignee: Wire Tester, Incorporated, Palmer, Mass.

[22] Filed: July 24, 1975

[21] Appl. No.: 598,695

[52] U.S. Cl. .............................. 324/51; 324/72.5; 339/97 T
[51] Int. Cl.² ....................................... G01R 31/02
[58] Field of Search .................. 324/51, 72.5, 133; 339/96, 97 T, 108 TP

[56] References Cited
UNITED STATES PATENTS

| | | | |
|---|---|---|---|
| 3,363,171 | 1/1968 | Sietmann et al. | 324/72.5 X |
| 3,768,005 | 10/1973 | Louks | 324/72.5 X |
| 3,864,629 | 2/1975 | Danna | 324/72.5 |

*Primary Examiner*—Gerard R. Strecker

[57] ABSTRACT

The continuity tester comprises means utilizing existing circuits for testing continuity together with a further integrated subassembly providing a completely self-contained circuit for testing stretches of wire unrelated to any circuit.

8 Claims, 2 Drawing Figures

ELECTRICAL WIRE CONTINUITY TESTING GUN

BACKGROUND OF THE INVENTION

The present invention relates to continuity testers more particularly to gun-type probes for checking the possibility of open circuits in wires in vehicles, buildings and other field installations and also in original electrical equipment, incident to manufacture and repair thereof.

The state of the art in such devices is represented by U.S. Pat. No. 3,363,171 granted Jan. 9, 1968 to Vernon H. Sietmann and Robert A. Louks and U.S. Pat. No. 3,768,005 granted Oct. 23, 1973 to Robert A. Louks and U.S. and foreign patents cited in both the above-enumerated patents. Such devices comprise a hand held implement resembling a pistol or hypodermic needle with an elongated barrel carried on a hand grip and barrel support body, the barrel containing a pierce probe with a forward end and with the barrel terminating at its forward end in a grappling hook defining a region in which a wire to be tested may be secured while the pierce probe is advanced forward to pierce the insulation of the wire and establish a contact between the wire and a pointed conductive forward end of the pierce probe. Such conductive contact is part of a complete circuit running through the length of the pierce probe to a signal of circuit completion, such as a light bulb or a buzzer, and also comprising an alligator clamp contained on the end of an extension wire extending from a device, which may be clipped to a portion of a circuit which includes the wire to be tested. Such devices also may be used for testing of terminals by establishing an external conductive portion, such as a conductive needle extension or a conductive body portion, without use of the grappling hook portion to grasp a wire.

It is an important object of the present invention to provide a reliable, consistently effective continuity tester of the class described.

It is a further object of the invention to provide the capability of testing the continuity of electrical wires and other conductors, apart from any circuit context consistent with the preceding object.

It is a further object of the present invention to provide economy and ease of manufacture consistent with one or both of the preceding objects.

It is a further object of the invention to provide a probe locking capability in devices of the class described consistent with one or more of the preceding objects.

It is a further object of the invention to provide ease of consumable parts replacement, consistent with one or more of the preceding objects.

It is a further object of the invention to provide terminal testing capability without reference to probe position in devices of the class described, consistent with one or more of the preceding objects.

It is a further object of the invention to provide a geometric envelope for the device which, in each of its three dimensions, it is not too large and not too small consistent with the device usage context, consistent with one or more of the preceding objects.

SUMMARY OF THE INVENTION

In accordance with the invention there is provided a pistol-form continuity testing device comprising a pistol barrel supported on a hand grip and barrel support sub-assembly, all of which parts thus far recited, are formed of, preferably, an integral one-piece molding preferably of plastic. A lever mechanism extending partially inside the device and partially outside, defines a trigger and a pusher for a pierce probe in a first-class lever pivotal mounting arrangement to the barrel support. A pierce probe comprising, preferably, a long metal rod with a pointed front end is slidably contained in the barrel and has a head which loads a compression spring in the barrel against an internal barrel flange formed by a necked down portion of the barrel, it being understood however that the equivalent arrangement could be made with respect to a tension spring loaded between the pierce probe and barrel. In either case, pulling the trigger advances the pierce probe and loads the spring and releasing the trigger, when it is not locked, allows unloading of the spring to retract the pierce probe entirely within the barrel.

The advance of the pierce probe advances its pointed end into a region for wire gripping defined by a grappling hook forward end of the barrel. A conductive extension probe comprises a piece of bent metal circumferentially surrounding an arc of over 180° of the barrel and slidable therealong with a bent detent of the strip riding in a longitudinal track provided on the barrel to prevent circumferential slide-slip and containing an extension which can be retracted to behind the forward end of the barrel or advance ahead of such forward end for terminal testing, the detent of the strip dropping through a hole in the base of the longitudinal barrel slit to contact the pierce probe for circuit completion, regardless of whether the pierce probe is advanced or retracted.

One or more additional holes may be provided along the barrel length for insertion of guide pins in the course of barrel molding to insure that a straight body is produced, which in turn facilitates assembly and use of the pierce probe and related parts therein.

The pierce probe engages contact means, such as the contacts strap along the barrel interior, and such contact means are in turn interconnected in parallel to a first outlet jack in the hand grip, preferably in a removable butt plate portion thereof, or alternatively, through a signal light and battery carried on the hand grip, preferably in the interior thereof, and then to a second outlet, also mounted on the hand grip, preferably inside the butt plate. An external extension cord comprises a plug at one end which may be inserted in the first outlet for testing a wire contained in a circuit having its own power source or, alternatively, may be plugged into the second outlet for testing a wire having no independent power source. The other end of the extension comprises connector means, such as an alligator clamp for completing the circuit in either case.

Certain subcombinations of the above defined subcombination are independently useful. For instances, the device as a whole may be supplied with or without a battery for the independent wire testing, leaving the user to supply his own battery in the latter case. The pistol device may be provided for a single mode of operation, omitting one or more of the extension probe, the first outlet and its connections or the second outlet and its connections and related parts, the common pistol device in all such variations providing the basis for a modular product line.

Other objects, features and advantages of the invention will be apparent from the following detailed description of preferred embodiments, taken in connection with the accompanying drawing.

BRIEF DESCRIPTION OF THE DRAWING

In which.

DETAILED DESCRIPTION OF PREFERRED EMBODIMENTS

Figure 1:
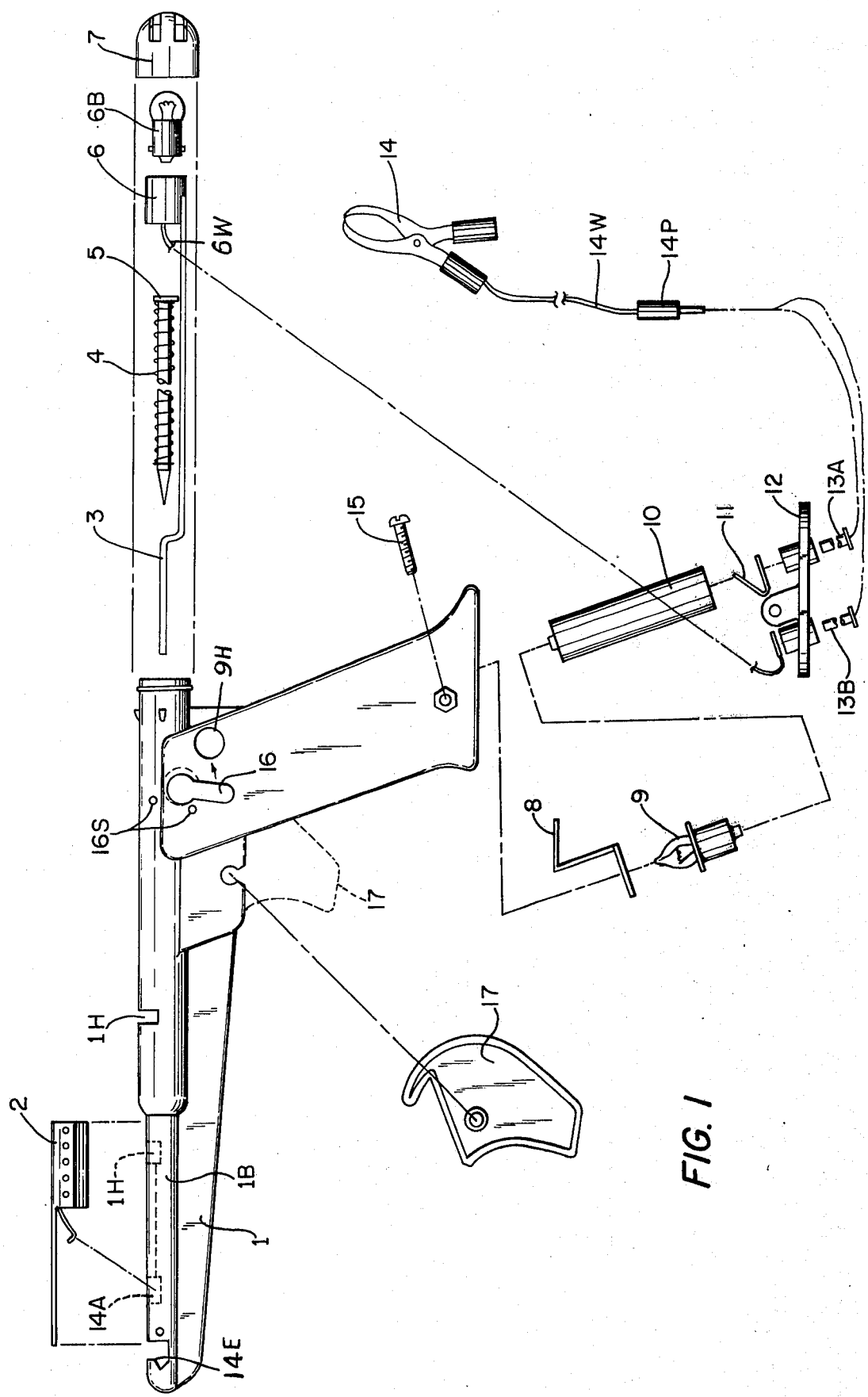
FIG. 1 is an exploded side view of a tester according to a preferred embodiment of the invention.

The tester comprises the above described barrel support body as indicated at 1, a barrel 1B and a butt 1C, extension 2, a contact strap 3, compression spring 4 surrounding pierce probe 5, a socket 6 and bulb 6B, bulb cover 7, a contact strap 8, bulb 9 which shows through hole 9H, 1.5 volt battery 10 (size AA), strap form spring 11, butt plate 12 and first and second outlets 13A and 13B. Connectable clip 14 has an extension wire 14W and plug 14P. A trigger 17 pushes pierce probe 5 and is lockable by a cam lock 16 movable between stops 16S.

The barrel has lateral holes 1H along its length, as mentioned above, for insertion of guide pins during molding to insure barrel straightness and smooth operation.

OPERATION

In using the above apparatus for testing wire continuity in a live circuit, plug 14P is inserted into outlet 13B and clamp 14 is clamped to ground. The wire to be tested is hooked by body end 14E. Then the operator pulls trigger 17 to drive pierce probe forward so that its pointed end penetrates the wire insulation to provide a new branch of the wire's circuit via probe 5, strap 3, bulb 6B, wire 6W and wire 14, lighting bulb 6 if the wire being tested has any breaks.

A terminal may be tested by sliding end extension 2 forward so that its spring detent 20 falls into hole 14A to contact probe 5 and complete a similar branch circuit to light bulb 6B if the terminal is live.

A wire, per se, or a wire in a powerless system is tested by inserting plug 14P in outlet 13A, and otherwise using the testing procedure for powered systems.

A pre-check of battery 10 and bulb 9 before powerless system testing, may be made by touching clamp 14 to the extended end of probe 5.

Figure 2:
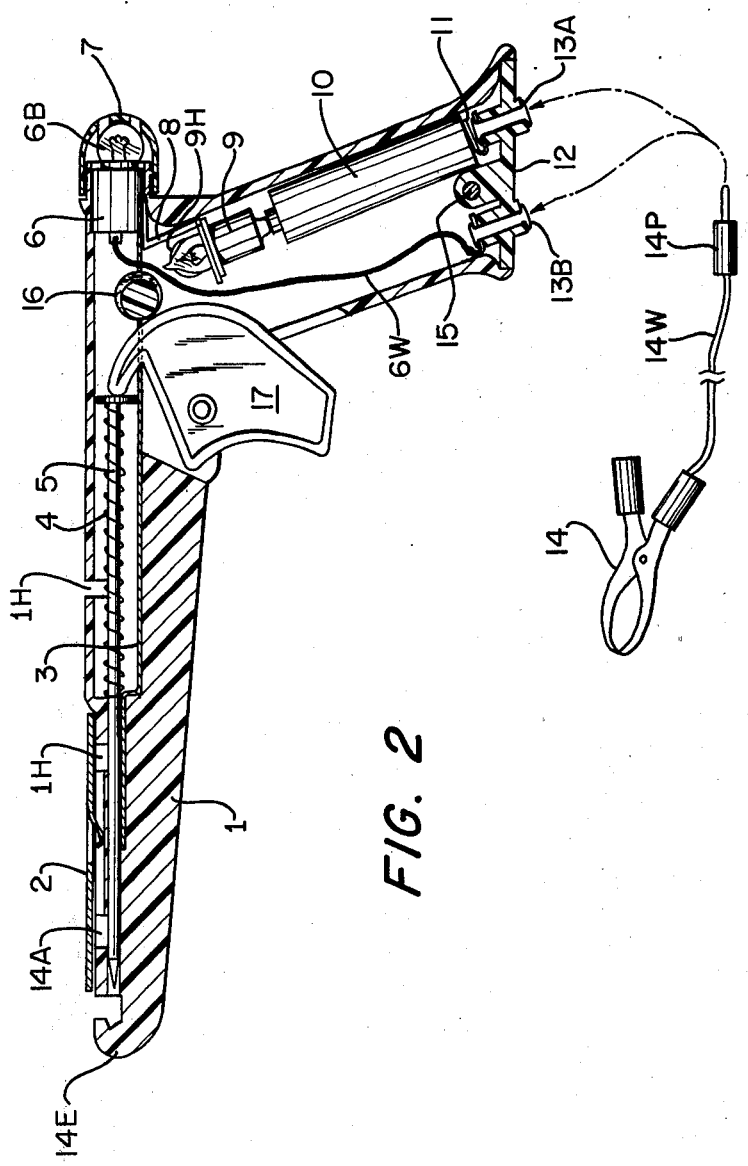
FIG. 2 is a cross-section view of the same apparatus assembled together, the section being down the longitudinal middle except for showing centered parts such as the battery, sockets, lamps, trigger and lock in full or at a section further toward the viewer than the center of the assembled apparatus.

FIG. 2 shows such parts assembled for functioning in accordance with the foregoing discussion.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

1. A pistol-form electrical continuity tester for testing electrical continuity of conductors in both powered and powerless systems, comprising, means defining a hand grip and barrel support body, means defining an elongated pistol barrel with open front and rear ends constituting an integrally formed extension of said hand grip and barrel support body, means defining a grappling hook adjacent the front end of said barrel which defines therewith a region for placing a wire to be tested and guard walls for locating such wire, means defining an electrically powerable signal light mounted at the rear end of the barrel and a light transmitting protective cover therefor, means defining a pierce probe within said barrel comprising a pointed forward end and being movable to a forward position with said end located in said region and a return position clear of said region and entirely withdrawn within said barrel, cam-form lever means defining a trigger outside the pistol structure and a cam-form pusher there within bearing against the pierce probe to move it forward and a first-class lever pivotal connection between said lever means and the pistol, means for selectively locking said lever means to maintain the pierce probe in its forward extended position without touching the trigger, means defining a compression spring surrounding the pierce probe which is loaded by forwarded movement of the pierce probe and unloaded by rearward movement thereof, means defining a first electrical outlet in said pistol hand grip, means defining an electrically conductive connection from the pointed tip of pierce probe the first signal light and an electrically conducted connection from the signal light to said first electrical outlet, means defining a second electrical outlet in said pistol grip, means defining a second electrically powerable signal light mounted from within said hand grip and a light transmitting protective cover therefor comprising said grip, means for mounting a battery from said hand grip, means forming a series circuit comprising an electrically conductive portion of said pierce probe, said second signal light, electrical connections connectable to a battery supported by said hand clip and said second outlet.

2. Apparatus in accordance with claim 1 and further comprising, an extension wire with a plug end insertable in either of said first or second outlets and a further external connection means.

3. Apparatus in accordance with claim 2 wherein said further extension comprises an alligator clamp.

4. Apparatus in accordance with claim 1 and further comprising, means defining a movable extension made of electrically conductive material mounted on said barrel and slidable there along and for selectively placing said extension in electrical contact with a conductive portion of said pierce probe, the connection between said probe extension and pierce probe being completable regardless of whether the pierce probe is extended forward or retracted rearwardly.

5. Apparatus in accordance with claim 4 wherein said last mentioned connecting means comprise a hole in the barrel and the springy detent strip inset probe extension which folds through said hole upon lateral alignment therewith and the longitudinally extending surface track within said barrel holding said springy detent joining forward and rearward movement of said probe extension to maintain circumferential alignment.

6. In a pistol-form electrical continuity tester system for testing electrical continuity of conductors in both powered and powerless systems, and including electrical circuit defining means and an improved pistol form tester with a hand grip and barrel support body, comprising, means defining an elongated pistol barrel with open front and rear ends constituting an integrally formed extension of said hand grip and barrel support body, means defining a grappling hook adjacent the front end of said barrel which defines therewith a region for placing a wire to be tested and guard walls for locating such wire, means defining a pierce probe within said barrel comprising a pointed forward end and being movable to a forward position with said end located in said region and the return position clear of said region and entirely withdrawn within said barrel, cam-form lever means defining a trigger outside the pistol structure and a cam-form pusher there within bearing against the pierce probe to move it forward and a first-class lever pivotal connection between said lever means and pistol, means for selectively locking said lever means to maintain the pierce probe in its forward extended position without touching the trigger, and means defining a compression spring surrounding the pierce probe which is loaded by forwarded movement of the pierce probe and unloaded by rearward movement thereof.

7. Apparatus in accordance with claim 6 and further comprising, means defining a movable extension made of electrically conductive material mounted on said barrel and slidable there along and for selectively placing said extension in electrical contact with a conductive portion of said pierce probe, the connection between said probe extension and pierce probe being completable regardless of whether the pierce probe is extended forward or retracted rearwardly.

8. Apparatus in accordance with claim 7 wherein said last mentioned connecting means comprise a hole in the barrel and the springy detent strip inset probe extension which falls through said hole upon lateral alignment therewith and the longitudinally extending surface track within said barrel holding said springy detent during forward and rearward movement of said probe extension to maintan circumferential alignment.

* * * * *